(12) United States Patent
Zazerra et al.

(10) Patent No.: US 6,372,700 B1
(45) Date of Patent: Apr. 16, 2002

(54) FLUORINATED SOLVENT COMPOSITIONS CONTAINING OZONE

(75) Inventors: Lawrence A. Zazerra, Edina; Frederick E. Behr, Woodbury; Michael J. Parent, Oakdale; Paul E. Rajtar, Hugo, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/540,590

(22) Filed: Mar. 31, 2000

(51) Int. Cl.$^7$ .......................... C09K 13/00; C11D 7/52
(52) U.S. Cl. .................. 510/175; 510/407; 510/411; 510/512; 510/415; 510/506; 252/571; 252/580; 252/79.4; 252/364; 252/372; 438/745
(58) Field of Search ................... 510/175, 407, 510/411, 412, 415, 506; 252/571, 580, 79.4, 364, 372; 438/745

(56) References Cited

U.S. PATENT DOCUMENTS

| | | | | |
|---|---|---|---|---|
| 3,235,335 A | * | 2/1966 | Churchill | 23/222 |
| 4,182,663 A | | 1/1980 | Vaseen | 204/157.1 |
| 5,603,750 A | | 2/1997 | Sierakowski et al. | 75/743 |
| 5,658,962 A | | 8/1997 | Moore et al. | 521/114 |
| 5,750,797 A | | 5/1998 | Vitcak et al. | 568/683 |
| 5,882,425 A | | 3/1999 | Graham | 134/1.3 |
| 5,914,003 A | | 6/1999 | Kosowski et al. | 162/81 |

FOREIGN PATENT DOCUMENTS

| | | |
|---|---|---|
| DE | 1294949 | 5/1969 |
| FR | 2287432 | 6/1976 |
| JP | 6-293686 | 10/1994 |
| JP | 7018565 | * 1/1995 |
| WO | WO 98/33208 | 7/1998 |
| WO | WO 99/15845 | 4/1999 |
| WO | WO 99/47480 | 9/1999 |

OTHER PUBLICATIONS

"Solubility Data Series", vol. 7, Oxygen & Ozone, Ed. R. Battino, *Pergamon Press*, pp. 484–486, 489, 492–493. No date given.
R. Brabets et al., "Solubility of Ozone in Some Fluorocarbon Solvents", *Journal of Fluorine Chemistry*, 41 311–320, Jul. 1988.
M.L. Perepletchikov et al., "Solubility of Ozone in Water–Acetone Mixtures and in Some Perfluorohydrocarbons", *Russian Journal of Physical Chemistry*, 64/9 (1990) pp. 2570–2572 (trans. pp. 1386–1387), Sep. 1990.
"Solubility of Oxygen In Nitric Acid Mixtures", *Solubilities*, Am. Chem SOc., vol. 11, 4$^{th}$ Ed., (1965) pp. 1239–1240, No month given.
"Comprehensive Inorganic Chemistry", *Pergamon Press*, (1973) pp. 785–787, No month given.
"Ozone", *Kirk–Othmer Encyclopedia of Chem. Tech.*, vol. 17, 4$^{th}$ Ed., John Wiley & Sons, pp. 953–994, No date given.
B. Froeschle et al., "In–Line X–Ray Photoelectron Spectroscopy for Anhydrous Hydrogen Fluoride Cleaning Optimization", *Electrochemical Society Proceedings*, vol. 97–35, (1998), pp. 415–422, No month given.
S.W. Francis, "Ozone", *McGraw–Hill Encyclopedia of Science & Technology*, 6$^{th}$ Edition, 12, NIO–OZO, pp. 609–612, No date given.
L.A. Zazzera et al., "XPS and SIMS Study of Anhydrous HF and UV/Ozone–Modified Silicon (100) Surfaces", *J. Electrochem. Soc.*, vol. 136, No. 2, (1989) p. 484–491, Feb. 1989.

* cited by examiner

*Primary Examiner*—Yogendra N. Gupta
*Assistant Examiner*—Brian P. Mruk
(74) *Attorney, Agent, or Firm*—Kent S. Kokko

(57) ABSTRACT

A homogeneous non-aqueous compositions containing a fluorinated solvent, ozone, and optionally a co-solvent and the use of these compositions for cleaning and oxidizing substrates is described.

15 Claims, No Drawings

FLUORINATED SOLVENT COMPOSITIONS CONTAINING OZONE

FIELD OF THE INVENTION

This invention relates to homogeneous non-aqueous compositions containing a fluorinated solvent, ozone, and optionally a co-solvent and the use of these compositions for cleaning and processing semiconductors and integrated circuits including silicon and Ga/As substrates.

BACKGROUND

The use of microelectronic devices, such as integrated circuits, flat panel displays and micro electromechanical systems, has burgeoned in new business and consumer electronic equipment, such as personal computers, cellular phones, and electronic calendars. Such devices have also become an integral part of more established consumer products such as televisions, stereo components and automobiles.

These devices in turn contain one or more very high quality semiconductor chips made from silicon wafers containing many layers of circuit patterns. Typically nearly 350 processing steps are required to convert a bare silicon wafer surface to a semiconductor chip of sufficient complexity and quality to be used, for example, in high performance logic devices found in today's personal computers. The most common processing step of semiconductor chip manufacture is wafer cleaning steps, accounting for over 10% of the total processing steps. These cleaning steps are normally one of two types: oxidative and etch. During oxidative cleaning steps, oxidative compositions are used to oxidize the silicon or polysilicon surface, typically by contacting the wafer with aqueous peroxide or ozone. During etch cleaning steps, etching compositions are used to remove native and deposited silicon oxide films and organic contaminants from the silicon or polysilicon surface before gate oxidation or epitaxial deposition, typically by contacting the wafer with aqueous acid. See, for example, L. A. Zazzera and J. F. Moulder, *J. Electrochem. Soc.*, 136, No. 2, 484 (1989). The ultimate performance of the resulting semiconductor chip will depend greatly on how well each cleaning step has been conducted.

Microelectromechanical systems (MEMS) (also called micromachines or micromechanical devices) are small mechanical devices which can be made using traditional integrated circuit manufacturing techniques. Typical devices include motors, gears, accelerometers, pressure sensors, actuators, and mirrors. The manufacture of MEMS results in a chip, or die, which contains the moving pieces of the device made from silicon or polycrystalline silicon (polysilicon) encased in silicon oxide. The die can also contain the circuitry necessary to run the device.

The etch cleaning and drying of MEMS has similar issues to those for semiconductor chip manufacture. Particulate contamination on micromachines can hinder movement of the device and ultimately affect device performance or cause failure. Care is taken to rinse the device with deionized water followed by ethyl alcohol or isopropanol but has similar problems to the IC in that the particles are not easily removed from devices due to the polysilicon surface energy and intricate designs.

In addition to the problem of particulate contamination, drying of MEMS following DI water rinses or alcohol rinses can lead to a phenomenon known as stiction. Stiction can be described as the adhesion of two surfaces due to adhesives forces as well as frictional forces. Polysilicon devices are typically 0.2–4.0 $\mu$m, but can range up to hundreds of $\mu$m, with lateral dimensions anywhere from 1–500 $\mu$m. The high surface area of these structures along with the tight tolerances between structures makes stiction a very troublesome problem. Stiction of microdevices can occur during use of the device, as a result of capillary condensation from exposure to humid air, or as a result of capillary effects during the drying of the device following the release etch process. See, for example, R. Maboudian and R. T. Howe, *J. Vac. Sci. Technol. B*, 15(1), 1–20 (1997). The high surface tensions of the aqueous or alcoholic rinses can greatly exacerbate the capillary effects and lead to a higher incidence of microstructure stiction following the release-etch and drying steps.

SUMMARY OF THE INVENTION

In one aspect, this invention relates to a cleaning composition useful in integrated circuit manufacture, the composition comprising a fluorinated solvent and ozone. The liquid cleaning composition may optionally contain a co-solvent to improve specific cleaning operations. Advantageously, the present invention provides substrate cleaning composition useful for oxidation of a substrate, removal of residues, rinsing and drying, but has an efficient rate of surface oxidation. The present composition may also be rendered non-flammable by appropriate selection of the fluorinated solvent. Substrates useful in the present invention include silicon, germanium, GaAs, InP and other III-V and II-VII compound semiconductors. It will be understood, due to the large number of processing steps involved in integrated circuit manufacture, that the substrate may include layers of silicon, polysilicon, metals and oxides thereof, resists, masks and dielectrics.

In yet another aspect, this invention relates to a cleaning process for substrates comprising contacting a substrate with a liquid cleaning composition comprising a fluorinated solvent and ozone; and then separating the cleaning composition from the processed substrate. The cleaning process makes more efficient use of the available ozone than conventional aqueous processes and achieves an oxidative cleaning rate comparable to that of conventional aqueous oxidative compositions. The present invention also improves safety by avoiding potentially hazardous "RCA" solutions that contain strong acids. The process and composition of this invention may also be used in the cleaning and etching of GaAs devices and substrates.

In yet another aspect, this invention relates to a cleaning process for silicon or polysilicon part in MEMS substrates with a homogeneous cleaning composition comprising a fluorinated solvent and ozone. The present invention provides silicon substrate cleaning composition that easily penetrates the intricate microstructures and wets surfaces on MEMS substrates. The cleaning composition is easily removed from MEMS and provides a dry, hydrophilic surface without residual water that would be present from an aqueous cleaning composition. Thus the present invention may avoid a drying step of the prior art, since contact with an aqueous solution is avoided.

In yet another aspect, this invention relates to a cleaning process for silicon or polysilicon part in MEMS chip with a homogeneous cleaning composition comprising a fluorinated solvent and ozone. Advantageously, the present invention provides a cleaning composition useful for oxidizing silicon or polysilicon surface in MEMS. The surface silicon oxide film is rendered hydrophilic thus reducing particle adhesion on the MEMS surfaces. The surface silanol groups present on the silicon oxide films of the treated silicon substrate are also available for reaction with surface modifying agents. The surface silicon oxide film also electrically isolates a silicon or polysilicon part in MEMS.

DETAILED DESCRIPTION

Compositions of this invention, comprising a fluorinated solvent and ozone are useful in the various cleaning steps of substrates required for subsequent operations. As used herein "cleaning" of silicon substrates will refer to any of oxidation of a substrate, removal of residues and/or particulates, rinsing and drying. As used herein "substrate" will refer to wafers or chips used in semiconductor manufacture, microelectromechanical devices, as well as glass surfaces. The compositions can effectively remove both inorganic particles, and organic residues, such as oils and greases, oxidize the silicon wafer surface to produce a hydrophilic silicon surface and additionally convert hydrophobic silicon hydrides to hydrophilic silicon oxides. As a result, many of these cleaning steps (e.g., oxidizing, rinsing and drying) can be combined into a single step.

The cleaning composition and method of this invention can improve manufacturing efficiency by lowering defects to increase wafer yield, or by decreasing cleaning times to increase wafer throughput. Further advantages of this invention include: (1) reduced processing time due to fewer chemical processing steps required; (2) reduced flammability of the cleaning compositions (e.g., as compared to compositions containing high levels of isopropyl alcohol); (3) elimination of aqueous rinsing steps that can leave particles on the wafer surface; (4) fewer particles remaining on treated substrates, possibly due to improved wetting of the substrates by the fluorinated solvent; (5) better removal of residues having both inorganic and organic components; (6) comparable oxidation rates relative to aqueous systems compositions and (7) less corrosive relative to prior art aqueous systems.

The improved performance is due in part to the low surface tension and low viscosity of the fluorinated solvents used. These low surface tension contribute to the improved wetting of the surfaces, and the low viscosity contributes to improved separation of the processed silicon substrate from the cleaning composition, better draining of the composition from the surface, and more efficient evaporation of the residue from the surface. The surface tensions of the fluorinated solvents are generally less than 20 dynes/cm and preferably between 10 and 20 dynes/cm when measured at 25° C. The viscosity values are generally less than 5, and preferably less than 1 centistokes at 25° C.

The compositions of this invention are preferably nonflammable, which is defined herein as having a flash point of greater than about 140° F. (about 60° C.) when tested according to ASTM D3278-89. Because the compositions may be used in the cleaning and processing of electronic devices, it is preferred that all components of the composition be highly pure and have low concentrations of particulates, metals and non-volatile residues. In particular, the fluorinated solvents used in the composition and process of the invention should have less than 3 particles (of greater than 5.0 micron diameter) /ml, less that 5000 parts per trillion of metals and less than 250 parts per trillion of non-volatile residues.

The ozone is generally added to the fluorinated solvent immediately prior to use by any conventional technique, such as sparging or gas injection. The dissolved ozone concentration in the fluorinated solvent is typically higher than the dissolved ozone concentration in conventional aqueous compositions prepared at the same temperature, pressure and concentration of gaseous ozone being injected.

Ozone is generated using commercially available ozone generators. The ozone generators typically use an electrostatic or (corona discharge) in an air or oxygen atmosphere. The ozone thus generated is bubbled through the fluorinated solvent. The temperature, pressure and concentration of gaseous ozone being injected will determine the concentration of dissolved ozone in the fluorinated solvent.

The concentration of ozone in the fluorinated solvents may be measured by any conventional technique including titrimetry, direct and colorimetric spectrometry, amperometry, by the oxidation-reduction potential, chemiluminescence, calorimetry, thermal conductivity and isothermal pressure change on decomposition. One convenient method is to extract the ozone/fluorinated solvent with aqueous KI. The liberated iodine is then measured spectrometrically or may be titrated with standard sodium thiosulfate solution.

The co-solvent, if used, is selected to enhance the cleaning or rinsing performance of the cleaning composition. The co-solvent should be essentially non-reactive with the ozone and not substantially reduce the solubility of the ozone in the fluorinated solvent. Useful co-solvents include ethers, esters, polyethers, carboxylic acids, tertiary alcohols, hydrofluorocarbons, hydrochlorocarbons, ketones and aliphatic hydrocarbon Representative examples of co-solvents which can be used in the cleaning composition include acetic acid, carbonic acid, formic acid, t-butyl alcohol, methyl t-butyl ether, methyl t-amyl ether, 1,2-dimethoxyethane, cyclohexane, 2,2,4-trimethylpentane, n-decane, acetone, methylcyclopentane, decalin, 2-butanone, methyl isobutyl ketone, methylene chloride, chlorocyclohexane, and 1-chlorobutane.

By substantially non-reactive it is meant that the co-solvent does not react with the ozone at an appreciable rate, or that the rate of oxidation of a silicon substrate is not significantly retarded. For this reason, co-solvents having carbon-carbon unsaturation are generally unsuitable for use. The co-solvent should be relatively volatile to facilitate evaporation from a silicon surface, with those having a b.p. of 120° C. or less being preferred, and is preferably substantially free of other contaminants such as metals, particulates and non-volatile residues in order to effectively clean the silicon surface at the maximum rate during the manufacturing process. Generally the co-solvent may comprise 30 wt. % or less of the composition.

Fluorinated solvents useful in compositions of this invention should be chosen such that a composition can be formulated which contains up to saturation quantities, general up to about 0.1% by weight of ozone and up to about 30% by weight of optional co-solvent. It is preferred that the concentration of ozone is 10 to 500 ppm.

For rapid evaporation during the drying step, the fluorinated solvent should have a boiling point of less than about 120° C. at atmospheric pressure. It is believed that the very low surface energy of the fluorinated solvents renders the composition much more effective as a cleaning composition: the low surface energy fluorinated solvents effectively wet the silicon surface much more readily than the conventional aqueous compositions of the prior art. Useful fluorinated solvents include hydrofluoroethers (HFEs), hydrofluorocarbons (HFCs), perfluorocarbons (PFCs), hydrohalofluoroethers (HHFEs) and hydrochlorofluorocarbons (HCFCs).

The fluorinated solvent of the present invention comprises a nonionic, fluorinated hydrocarbon that may be linear, branched, or cyclic, and optionally may contain one or more additional catenary heteroatoms, such as nitrogen or oxygen. The solvent may be selected from the group consisting of fully- and partially-fluorinated alkanes, amines, and ethers. Preferably, the fluorinated solvent is partially fluorinated and is non-functional, i.e. lacking functional groups that are polymerizable, reactive toward acids, bases, oxidizing agents, reducing agents or nucleophiles.

Preferably, the number of fluorine atoms exceeds the number of hydrogen atoms in the fluorinated solvent. To be non-flammable, the relationship between the number of fluorine, hydrogen, and carbon atoms can preferably be related in that the number of fluorine atoms is equal to or exceeds the sum of the number of number of hydrogen atoms and carbon-carbon bonds:

F atoms ≧ (#H atoms+#C—C bonds).

One class of compounds useful as fluorinated solvent comprises perfluorocarbons (PFCs) in which all carbon-bound hydrogen is replaced by fluorine atoms. Such compounds are known to be inert and exhibit high thermal and chemical stability. Such PFCs may include perfluoroalkanes, perfluoroamines and, perfluoroethers, which may be linear or branched, and cyclic or acyclic. Examples of PFCs include perfluoroalkanes having the general formula $C_nF_{2n+2}$, perfluoroethers and polyethers having the general formula $C_nF_{2n+2}O_m$ and perfluoroamines having the general formula $C_nF_{2n+3}N$, where n is an integer of 3 to 20 and m is 1 to 5.

Useful fluorinated solvents typically contain from 3 to 20 carbon atoms and may optionally contain one or more catenary heteroatoms, such as divalent oxygen or trivalent nitrogen atoms. The term "perfluorocarbon" or "PFC" as used herein includes organic compounds in which all (or essentially all) of the hydrogen atoms are replaced with fluorine atoms. Representative perfluorocarbons include cyclic and non-cyclic perfluoroalkanes, perfluoroamines, perfluoroethers, perfluorocycloamines, and any mixtures thereof. Specific representative perfluorocarbons include the following: perfluoropentane, perfluorohexane, perfluoroheptane, perfluorooctane, perfluoromethylcyclohexane, perfluorotributyl amine, perfluorotriamyl amine, perfluoro-N-methylmorpholine, perfluoro-N-ethylmorpholine, perfluoroisopropyl morpholine, perfluoro-N-methyl pyrrolidine, perfluoro-1,2-bis(trifluoromethyl)hexafluorocyclobutane, perfluoro-2-butyltetrahydrofuran, perfluorotriethylamine, perfluorodibutyl ether, and mixtures of these and other perfluorinated liquids.

Commercially available PFCs that can be used in this invention include: FLUORINERT FC-43™-Electronic Fluid, FLUORINERT FC-72™ Electronic Fluid, FLUORINERT FC-77™ Electronic Fluid, FLUORINERT FC-84™ Electronic Fluid, FLUORINERT FC-87™ Electronic Fluid, Performance Fluid PF-5060™, Performance Fluid PF-5070™, and Performance Fluid PF-5052™. Some of these liquids are described in FLUORINERT™ Electronic Fluids, product bulletin 98-0211-6086(212)NPI, issued February 1991, available from 3M Co., St. Paul, Minn. Other commercially available perfluorinated liquids that are considered useful in the present invention include perfluorinated liquids sold as GALDEN™ LS fluids available from Ausimont Inc., Italy, KRYTOX™ and VERTREL™ fluids available from DuPont and FLUTEC™ PP fluids available from BNFL Fluorochemicals Ltd.

Perfluorocarbons are known and can be made by techniques such as direct fluorination, electrochemical fluorination, addition polymerization of fluorine-containing monomers and the oxidative polymerization of fluorine containing monomers. See, for example, *Chemistry of Organic Fluorine Compounds II*, M. Hudlicky and A. Pavlath, Eds., ACS Monograph 187, American Chemical Society, Washington, D.C., 1995, pp. 95–120.

Perfluorocarbons, since they lack chlorine atoms, are not ozone-depleting agents, but these compounds may exhibit a global warming potential (GWP) due to their long atmospheric lifetimes. It is preferred that the fluorinated solvent be partially or incompletely fluorinated, i.e. contain at least one aliphatic or aromatic hydrogen atom in the molecule. These compounds generally are very thermally and chemically stable, yet are much more environmentally acceptable in that they degrade in the atmosphere and thus have a low global warming potential, in addition to a zero ozone depletion potential, and better solvency properties.

Partially fluorinated solvents suitable for use typically contain from 3 to 20 carbon atoms and may optionally contain one or more catenary heteroatoms, such as divalent oxygen or trivalent nitrogen atoms. Useful partially fluorinated liquids include cyclic and non-cyclic fluorinated alkanes, amines, ethers, and any mixture or mixtures thereof. Preferably, the number of fluorine atoms exceeds the number of hydrogen atoms and more preferably the number of fluorine atoms is equal to or exceeds the sum of the number of hydrogen atoms and carbon-carbon bonds. Although not preferred, due to environmental concerns, the partially fluorinated liquids optionally may contain one or more chlorine atoms provided that where such chlorine atoms are present there are at least two hydrogen atoms on the geminal or adjacent carbon atom(s).

One class of useful fluorinated solvents are hydrofluorocarbons; i.e. compounds having only carbon, hydrogen and fluorine, and optionally catenary divalent oxygen and/or trivalent nitrogen. Such compounds are nonionic, may be linear or branched, cyclic or acyclic. Such compounds are of the formula $C_nH_mF_{2n+2-m}$, where n is from about 3 to 20 inclusive, m is at least one, and where one or more non-adjacent —$CF_2$— groups may be replaced with catenary oxygen or trivalent nitrogen atoms. Preferably the number of fluorine atoms is equal to or greater than the number of hydrogen atoms, and more preferably the number of fluorine atoms is equal to or exceeds the sum of the combined number of hydrogen atoms and carbon-carbon bonds of fluorine atoms.

A preferred class of fluorinated solvents particularly useful to form the stable composition of the invention comprises hydrofluoroethers of the general formula:

$$(R_1\text{—}O)_n\text{—}R_2 \qquad (I)$$

where, in reference to Formula I, n is a number from 1 to 3 inclusive and $R_1$ and $R_2$ are the same or are different from one another and are selected from the group consisting of alkyl, aryl, and alkylaryl groups and their derivatives. At least one of $R_1$ and $R_2$ contains at least one fluorine atom, and at least one of $R_1$ and $R_2$ contains at least one hydrogen atom. $R_1$ and $R_2$ may also be linear, branched, cyclic or acyclic and optionally, one or both of $R_1$ and $R_2$ may contain one or more catenary heteroatoms, such as trivalent nitrogen or divalent oxygen. Preferably the number of fluorine atoms is equal to or greater than the number of hydrogen atoms, and more preferably the number of fluorine atoms is equal to or exceeds the sum of the number of hydrogen atoms and carbon-carbon bonds. Although not preferred, due to environmental concerns, $R_1$ or $R_2$ or both of them optionally may contain one or more chlorine atoms provided that where such chlorine atoms are present there are at least two hydrogen atoms on the $R_1$ or $R_2$ group on which they are present.

More preferably, the compositions of the present invention are prepared with hydrofluoroethers of the formula:

$$R_f\text{—O—R} \qquad (II)$$

where, in reference to Formula II above, $R_f$ and R are as defined for $R_1$ and $R_2$ of Formula I, except that $R_f$ contains at least one fluorine atom, and R contains no fluorine atoms. Such ethers may be described as segregated ethers in that the fluorinated carbons are segregated from the non-fluorinated carbons by the ether oxygen atom. More preferably, R is an acyclic branched or straight chain alkyl group, such as methyl, ethyl, n-propyl, iso-propyl, n-butyl, i-butyl, or t-butyl, and $R_f$ is preferably a fluorinated derivative of a cyclic or acyclic, branched or straight chain alkyl group having from 3 to about 14 carbon atoms, such as n-$C_4F_9$—, i-$C_4F_9$—, i-$C_3F_7$, (n-$C_3F_7$)CF— or cyclo-$C_6F_{11}$—, $R_f$ may optionally contain one or more catenary heteroatoms, such as trivalent nitrogen or divalent oxygen atoms.

In a preferred embodiment, $R_1$ and $R_2$, or $R_f$ and R, are chosen so that the compound has at least three carbon atoms, and the total number of hydrogen atoms in the compound is at most equal to the number of fluorine atoms. In the most preferred embodiment, $R_1$ and $R_2$ or $R_f$ and R are chosen so that the compound has at least three carbon atoms, and more preferably number of fluorine atoms is equal to or exceeds the sum of the number of combined hydrogen atoms and carbon-carbon bonds.

Representative hydrofluoroethers described by Formula II useful in the present invention include, but are not limited to, the following compounds:

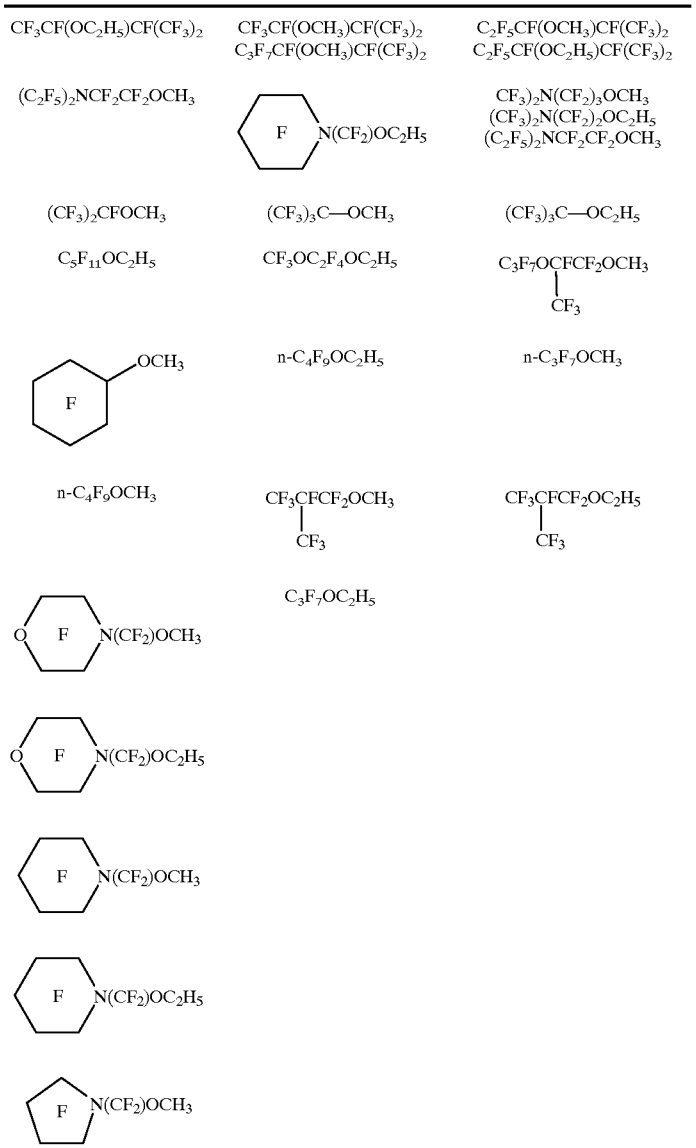

wherein cyclic structures designated with an interior "F" are perfluorinated.

Particularly preferred segregated hydrofluoroethers of Formula II include n-$C_3F_7OCH_3$, $(CF_3)_2CFOCH_3$, n-$C_4F_9OCH_3$, $(CF_3)_2CFCF_2OCH_3$, n-$C_3F_7OC_2H_5$, n-$C_4F_9OC_2H_5$, $(CF_3)_2CFCF_2OC_2H_5$, $(CF_3)_3COCH_3$, $(CF_3)_3COC_2H_5$, and mixtures thereof. Segregated hydrofluoroethers are available as 3M™ NOVEC™ HFE-7100 and HFE-7200 Engineered Fluids from Minnesota Mining and Manufacturing Company, St. Paul, Minn.

A number of synthetic routes to hydrofluoroethers are known. These methods may be broadly divided into two groups; methods of fluorinating an ether compound, and methods where the ether linkage is formed within a compound by reaction with a fluorine-containing precursor. The former methods include: (1) direct fluorination of an ether compound; and (2) electrochemical fluorination of an ether compound. The latter methods include: (3) the addition reaction of an alcohol to a fluorinated olefin; (4) alkylation of a partially fluorinated alcohol; and (5) non-catalytic alkylation of a fluorinated carbonyl compound with a suitable alkylating agent. Japanese Patent No. JP 6-293686 provides a partial summary description of these varied methods.

The segregated hydrofluoroethers (alkoxy-substituted perfluorocompounds) suitable for use in the process of the invention can be prepared by alkylation of perfluorinated alkoxides prepared by the reaction of the corresponding perfluorinated acyl fluoride or perfluorinated ketone with an anhydrous alkali metal fluoride (e.g., potassium fluoride or cesium fluoride) or anhydrous silver fluoride in an anhydrous polar, aprotic solvent. (See, e.g., the preparative methods described in French Patent Publication No. 2,287,432, German Patent Publication No. 1,294,949, and U.S. Pat. No. 5,750,797 (Flynn et al.). Alternatively, a fluorinated tertiary alcohol can be allowed to react with a base, e.g., potassium hydroxide or sodium hydride, to produce a perfluorinated tertiary alkoxide which can then be alkylated by reaction with alkylating agent.

Suitable alkylating agents for use in the preparation include dialkyl sulfates (e.g., dimethyl sulfate), alkyl halides (e.g., methyl iodide), alkyl p-toluenesulfonates (e.g., methyl p-toluenesulfonate), alkyl perfluoroalkanesulfonates (e.g., methyl perfluoromethanesulfonate), and the like. Suitable polar, aprotic solvents include acyclic ethers such as diethyl ether, ethylene glycol dimethyl ether, and diethylene glycol dimethyl ether; carboxylic acid esters such as methyl formate, ethyl formate, methyl acetate, diethyl carbonate, propylene carbonate, and ethylene carbonate; alkyl nitriles such as acetonitrile; alkyl amides such as N,N-dimethylformamide, N,N-diethylformamide, and N-methylpyrrolidone; alkyl sulfoxides such as dimethyl sulfoxide; alkyl sulfones such as dimethylsulfone, tetramethylene sulfone, and other sulfolanes; oxazolidones such as N-methyl-2-oxazolidone; and mixtures thereof.

As yet another alternative, the fluorinated ethers may be prepared by reacting a fluorinated carbonyl compound, such as a ketone or acid fluoride, with an alkylating agent in the presence of a Lewis acid catalyst as described in WO 99/47480 (Lamanna et al.).

Useful non-segregated hydrofluoroethers include alpha-, beta- and omega-substituted hydrofluoroalkyl ethers such as those described in U.S. Pat. No. 5,658,962 (Moore et al.), incorporated herein by reference, which can be described by the general structure shown in Formula III:

$$X-[R_f'-O]_yR''H \quad \text{(III)}$$

wherein:

X is either F, H, or a perfluoroalkyl group containing from 1 to 3 carbon atoms; each $R_f'$ is independently selected from the group consisting of $-CF_2-$, $-C_2F_4-$, and $-C_3F_6-$;

R" is a divalent organic radical having from 1 to about 3 carbon atoms, and is preferably perfluorinated; and y is an integer from 1 to 7, preferably from 1 to 3;

wherein when X is F, R" contains at least one F atom, and wherein the sum of the number of carbon atoms in the $R_f'$ group(s) and the number of carbon atoms in the R" group is between 4 and about 8.

Representative compounds described by Formula III useful in the present invention include, but are not limited to, the following compounds:

| | | |
|---|---|---|
| $HCF_2OCF_2OCF_2H$ | $HCF_2OCF_2OC_2F_4OCF_2H$ | $C_3F_7OCH_2F$ |
| $HCF_2OC_2F_4OCF_2H$ | $HCF_2OCF_2OCF_2OCF_2H$ | $HCF_2OC_2F_4OC_2F_4OCF_2H$ |
| $HC_3F_6OCH_3$ | $HC_3F_6OC_3F_6H$ | $C_4F_9OC_2F_4H$ |
| $C_5F_{11}OC_2F_4H$ | $C_6F_{13}OCF_2H$ | and |
| $C_3F_7O[CF(CF_3)CF_2O]_pCF(CF_3)H$, wherein p = 0 to 1 | | |

Preferred non-flammable, non-segregated hydrofluoroethers include $C_4F_9OC_2F_4H$, $C_6F_{13}OCF_2H$, $HC_3F_6OC_3F_6H$, $C_3F_7OCH_2F$, $HCF_2OCF_2OCF_2H$, $HCF_2OCF_2CF_2OCF_2H$, $HC_3F_6OCH_3$, $HCF_2OCF_2OC_2F_4OCF_2H$, and mixtures thereof. Non-segregated hydrofluoroethers specialty liquids are available from Ausimont Corp., Milano, Italy, under the GALDEN H™.

Useful fluorinated solvents also include hydrofluorocarbons (HFCs) having a 3- to 8-carbon backbone. The carbon backbone can be straight, branched, cyclic, or mixtures of these. Useful HFCs include compounds having more than approximately 5 molar percent fluorine substitution, or less than about 95 molar percent fluorine substitution, based on the total number of hydrogen and fluorine atoms bonded to carbon, but having essentially no substitution with other atoms (e.g., chlorine). Useful HFCs can be selected from:

(1) Compounds of Formula IV $$C_nH_mF_{2n+2-m}, \quad \text{(IV)}$$

wherein n is at least 3, and m is at least one.

Representative compounds of Formula IV include $CF_3CH_2CF_2H$, $CF_2HCF_2CH_2F$, $CH_2FCF_2CFH_2$, $CF_2HCH_2CF_2H$, $CF_2HCFHCF_2H$, $CF_3CFHCF_3$, and $CF_3CH_2CF_3$; $CHF_2(CF_2)_2CF_2H$, $CF_3CF_2CH_2CH_2F$, $CF_3CH_2CF_2CH_2F$, $CH_3CHFCF_2CF_3$, $CF_3CH_2CH_2CF_3$, $CH_2FCF_2CF_2CH_2F$, $CF_3CH_2CF_2CH_3$, $CHF_2CH(CF_3)CF_3$, and CHF(CF$_3$)CF$_2$CF$_3$; CF$_3$CH$_2$CHFCF$_2$CF$_3$, CF$_3$CHFCH$_2$CF$_2$CF$_3$, CF$_3$CH$_2$CF$_2$CH$_2$CF$_3$, CF$_3$CHFCHFCF$_2$CF$_3$, CF$_3$CH$_2$CH$_2$CF$_2$CF$_3$, CH$_3$CHFCF$_2$CF$_2$CF$_3$, CF$_3$CF$_2$CF$_2$CH$_2$CH$_3$, CH$_3$CF$_2$CF$_2$CF$_2$CF$_3$, CF$_3$CH$_2$CHFCH$_2$CF$_3$, CH$_2$FCF$_2$CF$_2$CF$_2$CF$_3$, CHF$_2$CF$_2$CF$_2$CF$_2$CF$_3$, CH$_3$CF(CHFCHF$_2$)CF$_3$, CH$_3$CH(CF$_2$CF$_3$)CF$_3$, CHF$_2$CH(CHF$_2$)CF$_2$CF$_3$, CHF$_2$CF(CHF$_2$)CF$_2$CF$_3$, and CHF$_2$CF$_2$CF(CF$_3$)$_2$; CHF$_2$(CF$_2$)$_4$CF$_2$H, (CF$_3$CH$_2$)$_2$CHCF$_3$, CH$_3$CHFCF$_2$CHFCHFCF$_3$, HCF$_2$CHFCF$_2$CF$_2$CHFCF$_2$H, H$_2$CFCF$_2$CF$_2$CF$_2$CF$_2$CF$_2$H, CHF$_2$CF$_2$CF$_2$CF$_2$CF$_2$CHF$_2$, CH$_3$CF(CF$_2$H)CHFCHFCF$_3$, CH$_3$CF(CF$_3$)CHFCHFCF$_3$, CH$_3$CF(CF$_3$)CF$_2$CF$_2$CF$_3$, CHF$_2$CF$_2$CH(CF$_3$)CF$_2$CF$_3$, and CHF$_2$CF$_2$CF(CF$_3$)CF$_2$CF$_3$; CH$_3$CHFCH$_2$CF$_2$CHFCF$_2$CF$_3$, CH$_3$(CF$_2$)$_5$CH$_3$, CH$_3$CH$_2$(CF$_2$)$_4$CF$_3$, CF$_3$CH$_2$CH$_2$(CF$_2$)$_3$CF$_3$, CH$_2$FCF$_2$CHF(CF$_2$)$_3$CF$_3$, CF$_3$CF$_2$CF$_2$CHFCHFCF$_2$CF$_3$, CF$_3$CF$_2$CF$_2$CHFCF$_2$CF$_2$CF$_3$, CH$_3$CH(CF$_3$)CF$_2$CF$_2$CH$_3$, CH$_3$CH(CF$_3$)CH$_2$CFHCF$_2$CF$_3$, CH$_3$CF (CF$_2$CF$_3$)CHFCF$_2$CF$_3$, CH$_3$CH$_2$CH(CF$_3$)CF$_2$CF$_2$CF$_3$, CHF$_2$CF(CF$_3$)(CF$_2$)$_3$CH$_2$F, CH$_3$CF$_2$C(CF$_3$)$_2$CF$_2$CH$_3$, CHF$_2$CF(CF$_3$)(CF$_2$)$_3$CF$_3$; CH$_3$CH$_2$CH$_2$CH$_2$CF$_2$CF$_2$CF$_2$CF$_3$, CH$_3$(CF$_2$)$_6$CH$_3$, CHF$_2$CF(CF$_3$)(CF$_2$)$_4$CHF$_2$, CHF$_2$CF(CF$_3$)(CF$_2$)$_4$CHF$_2$, CH$_3$CH$_2$CH(CF$_3$)CF$_2$CF$_2$CF$_2$CF$_3$, CH$_3$CF(CF$_2$CF$_3$) CHFCF$_2$CF$_2$CF$_3$, CH$_3$CH$_2$CH$_2$CHFC(CF$_3$)$_2$CF$_3$, CH$_3$C(CF$_3$)$_2$CF$_2$CF$_2$CF$_2$CH$_3$, CH$_3$CH$_2$CH$_2$CF(CF$_3$)CF(CF$_3$)$_2$ and CH$_2$FCF$_2$CF$_2$CHF(CF$_2$)$_3$CF$_3$.

Preferred HFCs include CF$_3$CFHCFHCF$_2$CF$_3$, C$_5$F$_{11}$H, C$_6$F$_{13}$H, CF$_3$CH$_2$CF$_2$H, CF$_3$CF$_2$CH$_2$CH$_2$F, CHF$_2$CF$_2$CF$_2$CHF$_2$, 1,2-dihydroperfluorocyclopentane and 1,1,2-trihydroperfluorocyclopentane. Useful HFCs include HFCs available under the VERTREL™, available from E. I. duPont de Nemours & Co. (e.g., CF$_3$CHFCHFCF$_2$CF$_3$); under the ZEORORA-H™, available from Nippon Zeon Co. Ltd., Tokyo, Japan; and under the HFC designation from AlliedSignal Chemicals, Buffalo, N.Y.

Useful fluorinated solvents also include hydrohalofluoroethers (HHFEs). For the present invention, HHFEs are defined as ether compounds containing fluorine, non-fluorine halogen (i.e., chlorine, bromine, and/or iodine) and hydrogen atoms. An important subclass of HHFEs is perfluoroalkylhaloethers (PFAHEs). PFAHEs are defined as segregated ether compounds having a perfluoroalkyl group and a haloalkyl group, wherein at least one of the halogen atoms of the haloalkyl group is chlorine, bromine, or iodine. Useful PFAHEs include those described by the general structure shown in Formula V:

$$R_f\text{—O—}C_aH_bF_cX_d \qquad (V)$$

wherein R$_f$ is a perfluoroalkyl group preferably having at least about 3 carbon atoms, most preferably from 3 to 6 carbon atoms, and optionally containing a catenary heteroatom such as nitrogen or oxygen; X is a halogen atom selected from the group consisting of bromine, iodine, and chlorine; "a" preferably is from about 1 to 6; "b" is at least 1; "c" can range from 0 to about 2; "d" is at least 1; and b+c+d is equal to 2a+1. Such PFAHEs are described in PCT Publication No. WO 99/14175, which is incorporated herein by reference. Useful PFAHEs include c—C$_6$F$_{11}$—OCH$_2$Cl, (CF$_3$)$_2$CFOCHCl$_2$, (CF$_3$)$_2$CFOCH$_2$Cl, CF$_3$CF$_2$CF$_2$OCH$_2$Cl, CF$_3$CF$_2$CF$_2$OCHCl$_2$, (CF$_3$)$_2$CFCF$_2$OCHCl$_2$, (CF$_3$)$_2$CFCF$_2$OCH$_2$Cl, CF$_3$CF$_2$CF$_2$CH$_2$OCHCl$_2$, CF$_3$CF$_2$CF$_2$CF$_2$OCH$_2$Cl, (CF$_3$)$_2$CFCF$_2$OCHClCH$_3$, CF$_3$CF$_2$CF$_2$CF$_2$OCHClCH$_3$, (CF$_3$)$_2$CFCF(C$_2$F$_5$)OCH$_2$Cl, (CF$_3$)$_2$CFCF$_2$OCH$_2$Br, and CF$_3$CF$_2$CF$_2$OCH$_2$I.

Useful fluorinated solvents also include HCFCs. For the present invention, HCFCs are compounds containing a carbon backbone substituted with carbon-bound fluorine, chlorine, and hydrogen atoms. HCFCs useful as heat transfer fluids include CF$_3$CHCl$_2$, CH$_3$CCl$_2$F, CF$_3$CF$_2$CHCl$_2$ and CClF$_2$CF$_2$CHClF. However, in the long term, HCFCs production may be banned due to ozone layer degradation.

Concentrations of ozone and fluorinated solvent components in the compositions of this invention can vary, depending upon the requirement of the silicon substrate, such as amount of surface oxidation required or amount of particulate and/or residue removal. In a cleaning composition useful concentration ranges are up to the saturation limit of ozone in a particular fluorinated solvent, and generally about 10 to 500 ppm ozone, about 0 to about 5% alcohol, and about 95 to about 99.99% fluorinated solvent. Preferably the concentration of ozone is about 50 to 250 ppm.

Ozone may be prepared by any procedure known to the art. Typically the ozone is prepared by passing oxygen or an oxygen containing gas such as air though a high voltage, alternating current electric discharge. The gaseous effluent, containing ozone is passed through a volume of fluorinated solvent, into which the ozone dissolves. Generation of ozone is more thoroughly described in *Kirk-Othmer Encyclopedia of Chemical Technology*, vol. 17, pp. 953–994, John Wiley and Sons (4$^{th}$ Edition, 1996)

In the method of the invention, a substrate is contacted with a composition comprising a fluorinated solvent and ozone and optionally co-solvent, for a time sufficient to clean the surface of the substrate. The cleaning method may be used to oxidize the surface to replace the hydrophobic silane (Si—H) groups with hydrophilic silanol (Si—OH) groups, remove particulates or residues, rinse and dry the surface or a combination of these. The method preferably comprises the additional step of separating the cleaned substrate from the cleaning composition.

The cleaning composition is used in the liquid state and any of the known techniques for "contacting" a substrate can be utilized. For example, a liquid cleaning composition can be sprayed, brushed or poured onto the substrate, or the substrate can be immersed in a liquid composition. Elevated temperatures, ultrasonic energy, and/or agitation can be used to facilitate the cleaning. Various different solvent cleaning techniques are described by B. N. Ellis in Cleaning and Contamination of Electronics Components and Assemblies, Electrochemical Publications Limited, Ayr, Scotland, pages 182–94 (1986).

After contacting, the substrate may be removed from the cleaning composition. Normally draining is sufficient to remove substantially all of the cleaning composition from the surface of the substrate. This may be enhanced by the application of heat, agitation, air jets, or spinning of the substrates (i.e. centrifugal removal processes) to effect more complete removal, as desired. Additionally the cleaning process may further comprise a rinsing step to ensure complete removal of the cleaning composition. The substrate may be rinse in any solvent known to be useful in the cleaning of substrates. Although alcohols are known in the art, their use represents a potential fire hazard. It is preferred to rinse in a fluorinated solvent (such as those previously described), which may be the same of different then that used in the cleaning composition.

Normally after extended use, replacement, renewal or purification of the composition is required. Such techniques including filtration to remove particulates, extraction to remove soluble residues or salts, decantation and distillation to recover the fluorinated solvent may be used. It will be noted that as a silicon surface is cleaned, the compositions begin to become contaminated. Removal of particulates and residues from the substrate lead to a build up of these materials in the composition. In particular the process may produce both water and various silanols. As the concentration of water increases, it will eventually phase separate from the composition as a less dense, water-rich phase. This may be easily separated from the cleaning composition by techniques known in the art, such as decantation or use of a weir. The cleaning composition may then be recycled. It is generally not necessary or desirable to recover any co-solvent from the spent cleaning composition, as these materials are present in small amounts and not readily recovered. It is more desirable to recover the fluorinated solvent and to add or charge ozone to it.

EXAMPLES

The present invention will be further described with reference to the following non-limiting examples. All parts, percentages and ratios are by weight unless otherwise specified.

Example 1

A 4 inch (100 mm) diameter silicon wafer, boron doped in the range of 30–60 ohm-cm with (100) orientation, single side polished, with a 200 angstrom layer of thermal silicon dioxide (available from MEMC Electronic Materials, St. Peters, Mo.), was diced into several small pieces, each piece approximately 20 mm×20 mm.

All the silicon wafer pieces were then cleaned using an oxidative cleaning process consisting of simultaneously treatment with ultraviolet light (UV) and ozone using a UV/ozone apparatus consisting of a 500 volt DC power supply and low pressure mercury grid lamp having quartz tubing (available from BHK Inc., Pomona, Calif.). The grid lamp was attached to a 5 in (13 cm)×5 in (13 cm) piece of polished aluminum that served as the top of the UV/ozone apparatus. Approximately 90% of the lamp intensity was at a wavelength of 254 nm, and approximately 5% was at 185 nm. The wafer pieces were placed on a mobile stage which was raised toward the lamp at the top of the UV/ozone apparatus until the pieces were at a distance of approximately 1 to 10 mm below the lamp. After approximately 10 minutes of exposure to the UV/ozone apparatus, one of the wafer pieces was removed and was re-tested for hydrophilicity/hydrophobicity using drops of DI water. The water drops wetted out the wafer surface, indicating that there was now a clean oxidized hydrophilic silicon oxide layer on the wafer surface.

The wafer pieces with hydrophilic layer were then immersed into an etch cleaning solution consisting of 1.3% anhydrous HF (available from Air Products & Chemicals, Allentown, Pa.), 6.7% isopropyl alcohol (IPA) and 92.0% 3M™ HFE-7100 Specialty Liquid (a blend of approximately 60% methyl perfluoroisobutyl ether and 40% methyl perfluoro-n-butyl ether, available from 3M Company, St. Paul, Minn.) for approximately 2 minutes. The wafer pieces were rinsed with a 95/5 blend of HFE-7100/IPA, and one of the wafer pieces was re-tested for hydrophilicity/ hydrophobicity using drops of DI water. The water drops beaded up and easily rolled off the wafer surface, indicating that there was now a hydrophobic silicon/silicon hydride layer on the wafer surface.

One of the hydrophobic wafer pieces was immersed in a saturated solution of ozone in HFE-7100 for 5 minutes. The wafer piece was then rinsed with the 95/5 blend of HFE-7100/IPA and was re-tested hydrophilicity/hydrophobicity using drops of DI water. This time the wafer surface was easily wet by the water droplets, indicating a highly hydrophilic layer had formed on the wafer surface. An X-ray photoelectron spectroscopy (XPS) Si2P spectrum analysis confirmed that a thin (i.e., less than 10 angstrom) layer of silicon dioxide was present on the wafer surface.

This experiment confirmed that a non-aqueous oxidative cleaning composition comprised of ozone and a hydrofluoroether fluorinated solvent can be effectively used to oxidize the surface of a silicon wafer.

What is claimed is:

1. A cleaning composition comprising a partially fluorinated solvent and ozone, wherein said fluorinated solvent comprises hydrofluoroethers of the general formula:

wherein n is a number from 1 to 3 inclusive, $R_1$ and $R_2$ are the same or are different from one another and am selected from the group consisting of substituted and unsubstituted alkyl, aryl, and alkylaryl groups, wherein at least one of $R_1$ and $R_2$ contains at least one fluorine atom, and at least one of $R_1$ and $R_2$ contains at least one hydrogen atom.

2. The composition of claim 1 wherein said fluorinated solvent comprises hydrofluoroethers of the general formula:

where $R_f$ and R are selected from the group consisting of substituted and unsubstituted alkyl, aryl, and alkylaryl groups, and wherein $R_f$ contains at least one fluorine atom, and R contains no fluorine atoms.

3. The composition of claim 2 wherein $R_f$ is perfluorinated.

4. The composition of claim 3 wherein said fluorinated solvent is selected from the group consisting of n-$C_3F_7OCH_3$, $(CF_3)_2CFOCH_3$, n-$C_4F_9OCH_3$, $(CF_3)_2CFCF_2OCH_3$, n-$C_3F_7OC_2H_5$, n-$C_4F_9OC_2H_5$, $(CF_3)_2CFCF_2OC_2H_5$, $(CF_3)_3COCH_3$, $(CF_3)_3COC_2H_5$, and mixtures thereof.

5. The composition of claim 1 further comprising a co-solvent.

6. The composition of claim 5 wherein said co-solvent is selected from the group consisting of ethers, esters, tertiary alcohols, carboxylic acids, ketones and aliphatic hydrocarbons.

7. The composition of claim 1 wherein said fluorinated solvent has a surface tension of less than 20 dynes/cm.

8. The composition of claim 1 wherein the fluorinated solvent is saturated with ozone.

9. The composition of claim 1 wherein the concentration of ozone is 10 to 500 ppm.

10. The composition of claim 1 having less than 3 particles of greater than 5.0 micron diameter/ml, less than 5000 parts per trillion of metals and less than 250 parts per trillion of non-volatile residues.

11. The composition of claim 1 wherein said fluorinated solvent has a boiling point of less than 120° C.

12. The composition of claim 5 wherein said cosolvent comprises 30 weight % or less of said composition.

13. The composition of claim 2 wherein said hydrofluoroethers are prepared by the alkylation of a perfluorinated alkoxide.

14. The composition of claim 1 wherein said hydrofluoroethers comprise compounds of the general formula:

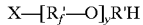

wherein
X is F, H or a perfluoralkyl group having 1 to 3 carbon atoms;
Each $R_f'$ is independently selected from the group of —$CF_2$—, —$C_2F_4$— and —$C_3F_6$—;
R" is a divalent organic radical having 1 to 3 carbon atoms; and
y is an integer from 1 to 7.

15. The hydrofluoroethers of claim 14 wherein R" is a perfluorinated, divalent organic radical.

* * * * *

UNITED STATES PATENT AND TRADEMARK OFFICE
CERTIFICATE OF CORRECTION

PATENT NO. : 6,372,700 B1
DATED : April 16, 2002
INVENTOR(S) : Zazzera, Lawrence A.

It is certified that error appears in the above-identified patent and that said Letters Patent is hereby corrected as shown below:

Title page,
Item [12], delete inventor name "Zazerra et al." and insert in place thereof
-- Zazzera et al. --.
Item [75], Inventors, delete inventor name "Lawrence A. Zazerra, Edina" and insert in place thereof -- Lawrence A. Zazzera, Edina --.
Item [56], References Cited, OTHER PUBLICATIONS, please add:
-- R. Maboudian et al., "Critical Review: Adhesion in Surface Micromechanical Structures", J. Vac. Sci. Technol. B, 15(1), (February 1997) pp. 1-20.
M. Hudlicky et al., "Chemistry of Organic Fluorine Compounds II: Replacement by Means of High-Valency Fluorides", ACS Monograph 187, American Chemical Society, Washington D.C., (1995), pp. 120-132.
B. N. Ellis, "Cleaning and Contamination of Electronic Components and Assemblies", Electrochemical Publications Limited, Ayr, Scotland, (1986), pp. 182-195.

Column 5,
Line 19, delete "#F atoms $\geqq$ (#H atoms+#C-C bonds)" and insert in place thereof
-- #F atoms $\geq$ (#H atoms+#C-C bonds) --.

Column 8,
Line 3 of table, second structure, delete "  "
and insert in place thereof

Line 3 of table, last column, delete "CF$_3$)$_2$N(CF$_2$)$_3$OCH$_3$" and insert in place thereof
-- (CF$_3$)$_2$N(CF$_2$)$_3$OCH$_3$ --.

Column 11,
Line 62, delete "CF$_3$CF$_2$CF$_2$CH$_2$OCHCl$_2$" and insert in place thereof
-- CF$_3$CF$_2$CF$_2$CF$_2$OCHCl$_2$ --

UNITED STATES PATENT AND TRADEMARK OFFICE
CERTIFICATE OF CORRECTION

PATENT NO. : 6,372,700 B1
DATED : April 16, 2002
INVENTOR(S) : Zazzera, Lawrence A.

It is certified that error appears in the above-identified patent and that said Letters Patent is hereby corrected as shown below:

Column 14,
Line 10, delete "am" and insert in place thereof -- are --.
Line 55, delete "X-[$R_f'$-O]$_y$R'H" and insert in place thereof -- X-[$R_f'$-O]$_y$R"H --.

Signed and Sealed this

Seventh Day of October, 2003

JAMES E. ROGAN
*Director of the United States Patent and Trademark Office*